(12) United States Patent
Roy et al.

(10) Patent No.: US 7,284,218 B1
(45) Date of Patent: Oct. 16, 2007

(54) METHOD AND SYSTEM FOR INPLACE SYMBOLIC SIMULATION OVER MULTIPLE CYCLES OF A MULTI-CLOCK DOMAIN DESIGN

(75) Inventors: Sumit Roy, San Jose, CA (US); Gagan Hasteer, San Jose, CA (US); Anmol Mathur, San Jose, CA (US)

(73) Assignee: Calypto Design Systems, Inc., Santa Clara, CA (US)

( * ) Notice: Subject to any disclaimer, the term of this patent is extended or adjusted under 35 U.S.C. 154(b) by 299 days.

(21) Appl. No.: 11/084,778

(22) Filed: Mar. 18, 2005

(51) Int. Cl.
*G06F 17/50* (2006.01)
(52) U.S. Cl. ............................................ 716/6; 703/14
(58) Field of Classification Search ................ 716/4–6; 703/13–14
See application file for complete search history.

(56) References Cited

U.S. PATENT DOCUMENTS

| 6,557,151 B1 * | 4/2003 | Donath et al. ................. 716/6 |
| 2004/0049371 A1 * | 3/2004 | Fraer et al. ................... 703/14 |
| 2005/0268265 A1 * | 12/2005 | Ly et al. ........................ 716/6 |

* cited by examiner

Primary Examiner—Stacy Whitmore
(74) Attorney, Agent, or Firm—William L. Botjer (57) ABSTRACT

A method and a system for inplace symbolic simulation of circuits. This method is applicable to both single clock and multiple clock domain designs. The method performs inplace symbolic simulation by appending slots to the various objects of the circuit. The slot associated with an object is a function of time, and it represents the functionality of the element at a given time. The method comprises the steps of determining a phase-list, determining ticks associated with each object of the circuit. Based on these ticks, slots are generated. Further, relations between the slots of the various objects of the circuit are captured.

24 Claims, 8 Drawing Sheets

Prior Art

METHOD AND SYSTEM FOR INPLACE SYMBOLIC SIMULATION OVER MULTIPLE CYCLES OF A MULTI-CLOCK DOMAIN DESIGN

BACKGROUND

The present invention relates to the field of computer-aided design of integrated circuits, and in particular, to symbolic representation of digital logic circuits.

The increase in the complexity of integrated circuits has made it imperative to verify design correctness prior to fabrication. The verification of design correctness, prior to fabrication, is essential because any design flaw detected after fabrication can have a severe economic impact in terms of increased time-to-market and reduced profit margins.

One of the basic steps involved in computer-aided design of integrated circuits is the symbolic representation of the digital logic circuit. This symbolic representation of the circuit finds several applications, such as verification of design correctness. The two methods used for verifying design correctness are model checking and equivalence checking.

Model checking is used to check the correctness of a circuit design by checking if the circuit model conforms to all properties and requirements of the circuit. Here, the desired functionality of a circuit is expressed as a collection of properties or specifications, and possibly as a model. Equivalence checking is used to verify a circuit design by checking the design against a standard design that performs the same function. Equivalence checking ascertains whether the two circuits are equivalent, i.e., they result in the same outputs for a given set of inputs. If an equivalence checker determines that the outputs of the two circuits are the same for a given set of inputs, then the two circuits are termed equivalent to one another. Model checking and equivalence checking require representing the circuits symbolically, and subsequently using these symbolic representations for checking the correctness of a model and equivalence of the two circuits.

Circuits can be classified into two categories: combinational circuits and sequential circuits. A combinational circuit is a circuit in which the output depends entirely on the values of the current inputs to the circuit. A simple example of a combinational circuit is a series of interconnected AND gates, in which none of the outputs is fed back to the AND gates.

A sequential circuit is a circuit, the output of which depends on the previous input/output values of the circuit objects, in addition to the current input values. Therefore, a sequential circuit comprises one or more combinational circuits, wherein, the output values may be fed back to the combinational circuits via storage elements. The storage elements may be implemented using flip-flops, latches, or registers.

There exist many equivalence checking techniques and tools for equivalence checking in combinational circuits. The research paper titled 'Equivalence Checking Using Cuts and Heaps', by Andreas Kuehlmann and Florian Krohm, Annual ACM IEEE Design Automation Conference, 34th annual conference, volume 00, pages 263-268, Published in 1997 describes one such approach. Another technique is described in the research paper titled 'Combinational Equivalence Checking through Function Transformation', by Hee Hwan Kwak, InHo Moon, James H. Kukula, and Thomas R. Shiple, 2002 International Conference on Computer-Aided Design (ICCAD '02), November 2002, pages 526-533.

Equivalence checking in the case of sequential circuits is relatively complex. This is because of the presence of storage elements, which are responsible for generating different sets of output values for the same set of input values. The storage elements are triggered by the clock(s) associated with the circuit; and because of the sequential nature of computation, the final output is derived after a cycle(s) of the clock(s).

The same logic can be implemented using multiple circuit designs, and each circuit design may give outputs at different clock cycles, for example, one circuit may give an output in two cycles and another circuit may give an output in three cycles.

Methods of equivalence checking often involve converting the sequential circuits to equivalent combinational circuits and then performing the equivalence check. A common method of converting sequential circuits to combinational circuits is unrolling the circuits in time and representing them in space. This is also called machine acceleration.

Figure 1:
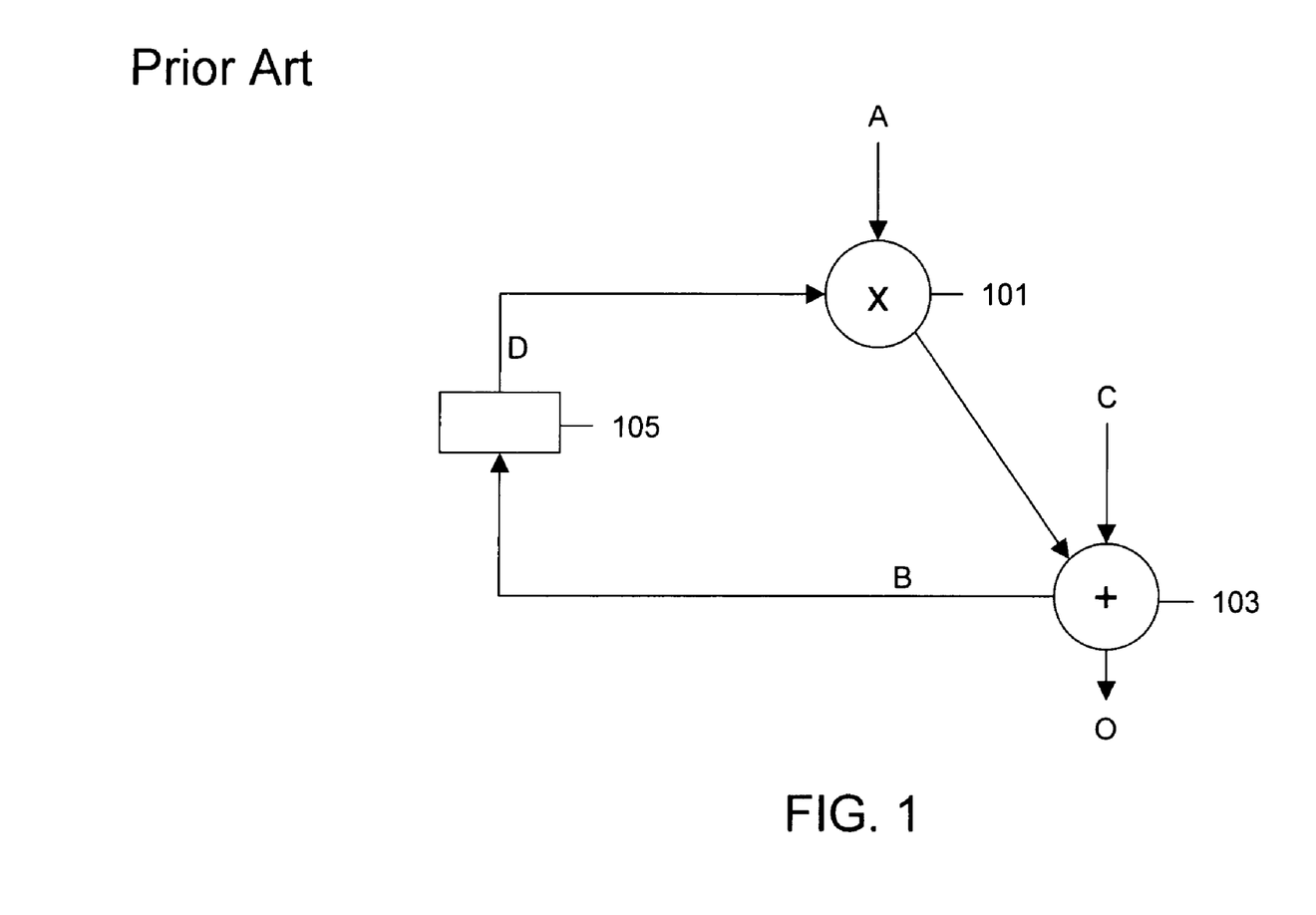
FIG. 1 illustrates a circuit diagram of a logic circuit.
Figure 3:
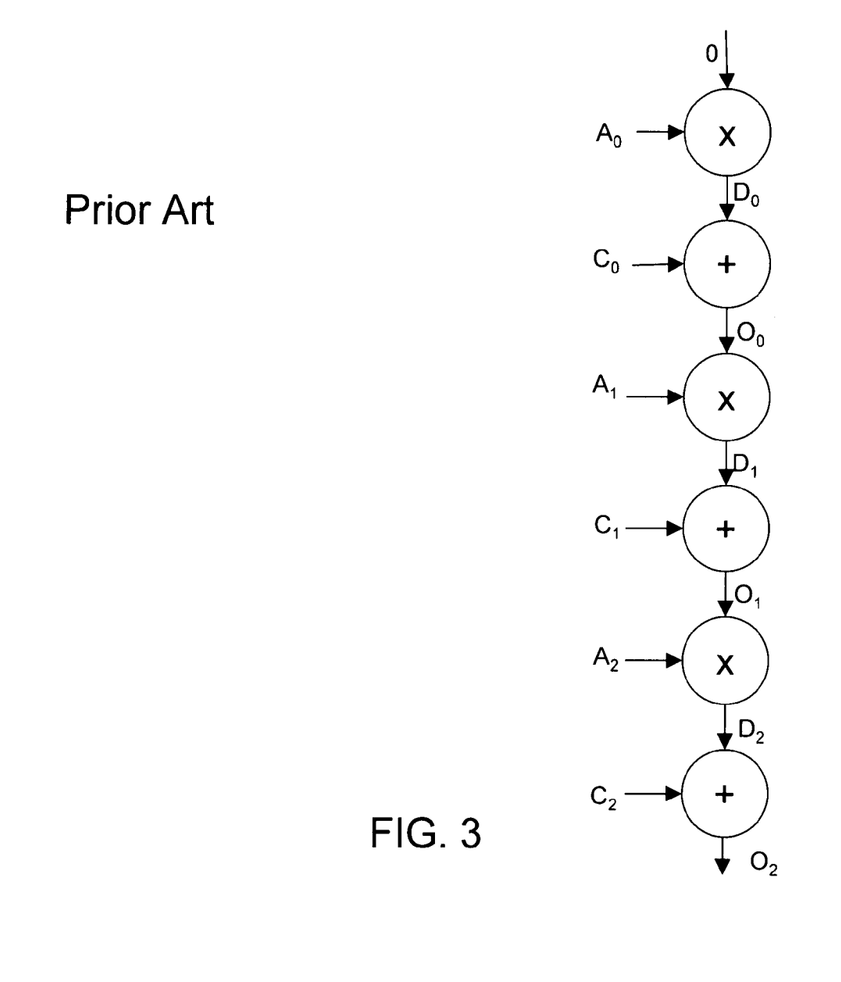
FIG. 3 illustrates an unrolled version of the circuit of FIG. 1.

Machine acceleration requires replicating the netlist corresponding to the sequential circuit, i.e., the objects of the netlist (edges and nodes) are replicated in the unrolling step. The unrolled version of a circuit represented in FIG. 1 is illustrated in FIG. 3. In this case, unrolling has resulted in multiple replications (three in this case) of the associated objects and information. Machine acceleration, therefore, increases the memory requirements of the system. Further, memory requirements increase with the complexity and size of the circuits.

FIG. 1 shows a circuit diagram of a logic circuit. This circuit implements the following logic:

$$O_0=0;$$

For i=0 to 2, $O_i=C_i+(O_{i-1}+A_i)$

The circuit comprises two adders—adder 101 and adder 103—and a register 105. This circuit is controlled by a single clock that guides register 105. Register 105 functions as a memory element and stores the values that are output from adder 103. Register 105 is positive-edge triggered. Updating values stored by register 105 requires a trigger from the associated clock, i.e., a value will be stored in register 105 for one cycle of the clock, in the next cycle this value will be provided as an output and the stored value will be replaced by another value.

Signals A and C represent the primary inputs to the circuit. Signal A is a primary input for adder 101 and signal C is a primary input for adder 103. Register 105 stores the output of adder 103. The initial value stored in register 105 is $O_0=0$.

Figure 2:
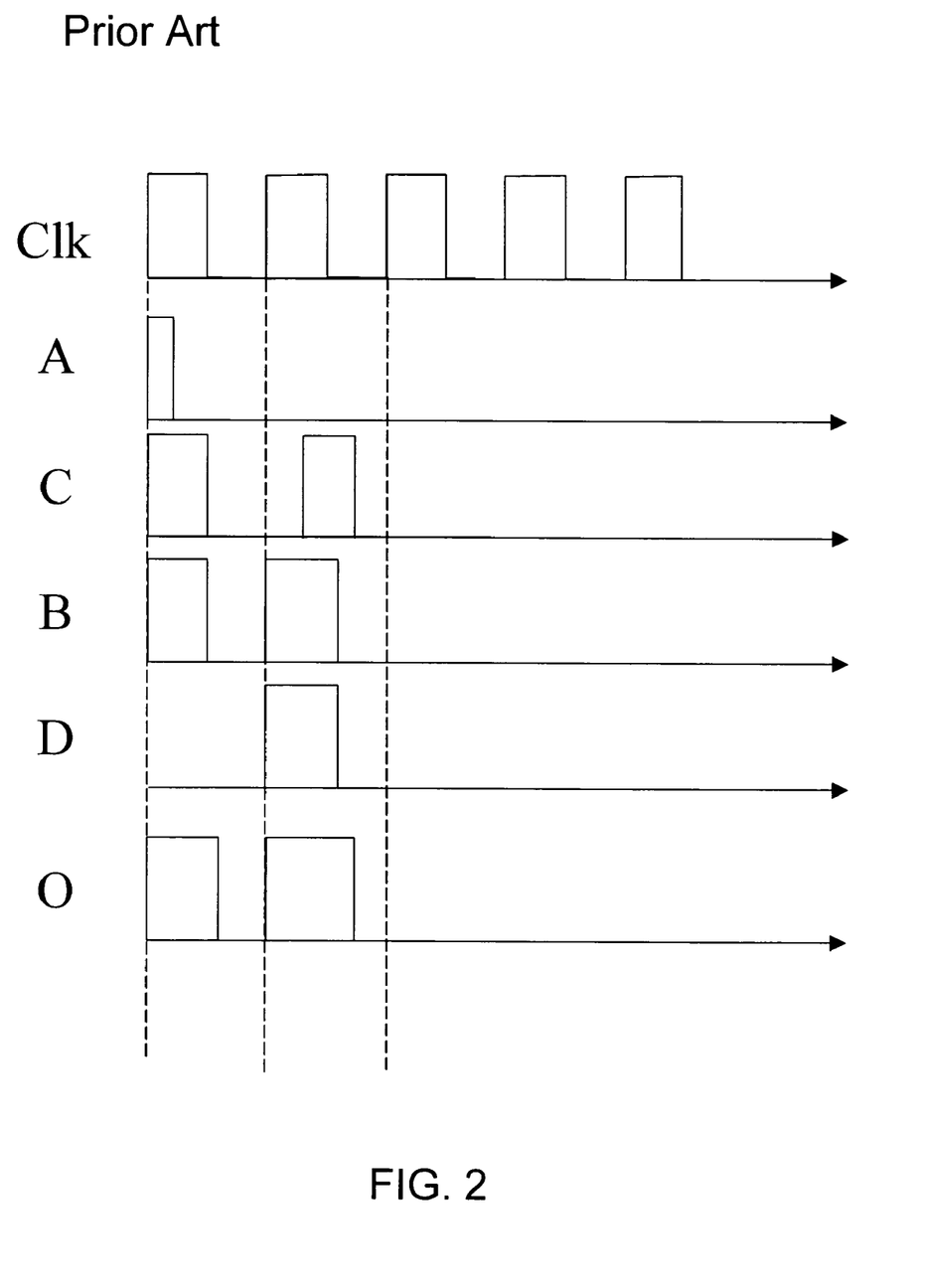
FIG. 2 is a timing diagram corresponding to the circuit of FIG. 1.

The circuit represented in FIG. 1 implements the underlying logic in three cycles of the associated clock. This has been further illustrated with the help of a timing diagram, which is represented in FIG. 2.

The circuit represented in FIG. 1 performs the following sequence of events:

First Cycle

Step 1: During the first cycle, the value stored in register 105 is $O_0=0$. In step 1, adder 101 adds external input $A_0$ and the initial value ($O_0=0$) stored in register 105 and gives output '$A_0+O_0$';

Step 2: Adder 103 takes the output of adder 101 and $C_0$ as input and adds them to give output '$A_0+O_0+C_0$';

Second Cycle

Step 3: In the second cycle of the clock, the value stored in register 105 is updated and replaced by the output of adder 103, i.e., '$A_0+O_0+C_0$';

Step 4: Adder 101 adds the value stored in register 105, i.e., '$A_0+O_0+C_0$' and another external input $A_1$ and gives output '$A_0+O_0+C_0+A_1$';

Step 5: Adder 103 takes the output of adder 101, i.e., '$A_0+O_0+C_0+A_1$' and $C_1$ as input and adds them to give output '$A_0+O_0+C_0+A_1+C_1$';

Third Cycle

Step 6: In the third cycle of the clock, the value stored in register 105 is updated and replaced by the output of adder 103, i.e., '$A_0+O_0+C_0+A_1+C_1$';

Step 7: Adder 101 adds the value stored in register 105, i.e., '$A_0+O_0+C_0+A_1+C_1$' and another external input $A_2$ and gives output '$A_0+O_0+C_0+A_1+C_1+A_2$'; and Step 8: Adder 103 takes the output of adder 101, i.e., '$A_0+O_0+C_0+A_1+C_1+A_2$' and $C_2$ as input and adds them to give the final output O, which is equal to '$A_0+O_0+C_0+A_1+C_1+A_2+C_2$'.

Therefore, in the first cycle of the clock, step 1 and step 2 will take place; in the second cycle, step 3, step 4 and step 5 will take place; and in cycle 3, step 6, step 7 and step 8 will take place.

The same logic:

$O_0=0$;

For i=0 to 2, $O_i=Ci+(O_{i-1}+A_i)$ can be implemented by a different circuit (a circuit configured in a different manner), which may require different number of clock cycles to complete the computation.

The comparison of two such circuits involves unrolling the circuits in time and representing them in space. In circuit unrolling, a circuit is represented such that it implements the underlying logic in one clock cycle. Two circuits can be compared by first unrolling them and then comparing their outputs for a given set of inputs.

FIG. 3 illustrates an unrolled version of the circuit represented in FIG. 1. The circuit represented in FIG. 3 computes the function in one cycle, which is computed by the circuit represented by FIG. 1 in three cycles.

Unrolling of a circuit results in the replication of the associated information (for example, each adder has been replicated three times in the unrolled version of the circuit), thereby increasing the number of elements in the unrolled circuit. Because of the replication of information, the memory size required to store the unrolled circuit configuration increases. Further, the memory requirements increase with the complexity and size of the circuits.

As described above, the circuit shown in FIG. 1 is controlled by a single clock. The clock guides register 105. Such circuit designs, each of which is guided by a single clock, are called single-clock-domain designs. Circuit designs, each of which is guided by multiple clocks, are called multi-clock-domain designs. In such circuits, different elements may be guided by different asynchronous clocks. For example, consider a serializer/deserializer (SERDES) that provides input to a chip. The SERDES provides input to the chip along with the clock. This clock, in all likelihood, will be asynchronous to the clock used in the chip at the consumer end. To capture the input, the chip comprises a logic that synchronizes the input to the chip's clock. This logic is guided by both the clocks, i.e., the clock of the SERDES and the clock of the chip design. In other words, this logic works on an asynchronous multi-clock-domain design. Asynchronous multi-clock-domain designs are used in many other real life situations, for example, two communicating circuits, such as routers.

The symbolic simulation of multi-clock domain designs poses many problems. Conventional methods of symbolic representation for multi-clock-domain designs include steps for converting the circuit to an equivalent single-clock-domain design. This is only possible under the following restrictions:

The period of all the clocks have to be a multiple of the period of the fastest clock in the design; and the active edge of all the clocks should coincide with the rising/falling edge of the fastest clock.

In certain cases, such as the above examples (containing asynchronous clocks), these restrictions are not fulfilled.

In light of the above discussion, there is a need for a method and a system that reduces memory requirements for representing circuit designs for different applications, such as design verification (equivalence checking, model checking, etc.). In addition, a method and a system that is capable of symbolically representing multi-clock-domain designs is required.

SUMMARY

The present invention provides a method for inplace symbolic simulation of circuits. The present invention is applicable to both single-clock domain and multi-clock domain designs.

An object of the present invention is to provide a method for inplace symbolic simulation of multi-clock domain designs.

Yet another object of the present invention is to provide a method for symbolic simulation that reduces memory requirements for storing the simulated circuit.

According to the present invention, unrolling of a circuit is performed through a slot mechanism. Slots are associated with every object of the netlist of the circuit. A Slot associated with an object is a memory location that holds the functionality of the object at time 't'. The functionality held by a Slot may be represented as:

Slot (E, t); where,

E represents the object with which the slot is associated; and t represents the time.

The functionality of an object from time=0 and time=t is simulated by traversing the fan-in cone. Sometimes, we will use the functionality held by the Slot and the Slot interchangeably.

The functionality of the object at time=t is dependent upon all the active clock triggers till time=t. This is so, because in a sequential circuit the value of any object at time=t is dependent upon all the previous values of the objects that feed their output to this object; and the change in the value of an object of a circuit is triggered by the active clock triggers. Active clock triggers for an object are defined as tick. Tick is a function of time and phase-list wherein a Phase-list (E) represents all the phases on which the signal value of edge E can potentially change. A phase is the rising or falling edge of one clock.

A phase-list (E) represents sufficient conditions for a value change on the edge. It represents the maximum number of evaluations that a cycle-based simulator needs to perform to identify the values of that edge.

The static computation of a phase-list may be done in the following manner:

If an edge is driven by a primary input,

Phase-list (E)=phases of the primary input node as provided by user;

If an edge is driven by a combinational gate;

Phase-list (E)=merging of all the phase-lists of the input edges of the combination gate; and If an edge is driven by a sequential element, Phase-list (E)=phase-list of the clock-signal that is input into the sequential element.

Tick can be defined as the number of active clock edges for phase-list (E) that occur between time 0 and t, and is represented as:

Tick [t, phase-list (E)]; where t=time; and

Phase-list (E) represents all the phases on which the signal value of the edge can change.

Now, Slot (E, t) can be expressed as follows:

Slot (E, t)=functionality of E at time t=0;

=functionality of E after x clock triggers where x=Tick [t, phase-list (E)]

Again, to emphasize, we note that a phase-list represents sufficient conditions for a value change of an associated object. Tick, a function of phase-list and time t, represents the active clock triggers for an object for a particular time t. The value of the object E at any time 't' can be calculated by evaluating the functionality held in Slot (E, t).

In this manner, slots are created for every object in the netlist. These slots provide the signal value of the associated object at any time. Thereafter, the relationship between the slots is identified. For example, for a circuit that is driven by a single clock, the phase-list and the tick function will coincide for all the edges. For circuits that are driven by multiple clocks, the phase-list for different objects may be different. Therefore, the number of slots may be different for different edges (or different objects). In these cases also, the relation between the various slots is identified and captured by our algorithm.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF THE PREFERRED EMBODIMENTS

To alleviate the requirement for a large memory, the present invention provides a new algorithm and compact database that can represent and store the unrolled circuit in significantly less space. The representation of an unrolled circuit does not involve replication of the information.

Further, the present invention is also applicable to multi-clock domain designs, as the method of symbolic representation is not dependent upon converting a multi-clock domain design to single-clock-domain design.

The present invention performs unrolling through a slot mechanism. In other methods, the objects of the netlist (unrolled objects) are implicitly suspended from the slots of the corresponding object vis-à-vis their replication during unrolling.

The slots associated with an object represent the functionality of the object at time 't'. A slot may be represented as:

Slot (E, t); where

E represents the object with which the slot is associated; and t represents the time.

The functionality of an object from time=0 and time=t is simulated by traversing the fan-in cone.

The functionality of the object at time=t is dependent upon all the active clock triggers till time=t. This is so, because in a sequential circuit the value of any object at time=t is dependent upon all the previous values of the objects that feed their output to this object; and the change in the value of an object of a circuit is triggered by the active clock triggers.

Active clock triggers for an object are defined by tick. Tick is a function of time and phase-list.

Phase-list (E) represents all the phases on which the signal value of the edge can change. A phase is the rising or falling edge of a clock.

A phase-list (E) represents sufficient conditions for a value change on the edge. It represents the maximum number of evaluations that a cycle-based simulator needs to perform to identify the values of that edge.

The static computation of phase-list may be done in the following manner:

If an edge is driven by a primary input,

Phase-list (E)=phases of the primary input node as provided by the user;

If an edge is driven by a combinational gate,

Phase-list (E)=merging of all the phase-lists of the input edge of the combination gate; and If an edge is driven by a sequential element, Phase-list (E)=phase-list of the clock-signal that is input into the sequential element.

Tick can be defined as the number of active clock edges for phase-list (E) that occur between time 0 and t, and can be represented as:

Tick [t, phase-list (E)]; where t=time; and

Phase-list (E) represents all the phases on which the signal value of the edge can change.

Now, Slot (E, t) can be expressed as follows:

Slot (E, t)=functionality of E at time t=0;

=functionality of E after x clock triggers where x=Tick [t, phase-list (E)]

A phase-list represents sufficient conditions for a value change of the object. Tick represents the maximum number of evaluations that a cycle-based simulator needs to perform to identify the values of that object. The value of the object at any time 't' can be calculated based on the value of Slot (E, t) and the associated operations. This is explained in detail later.

Figure 4:
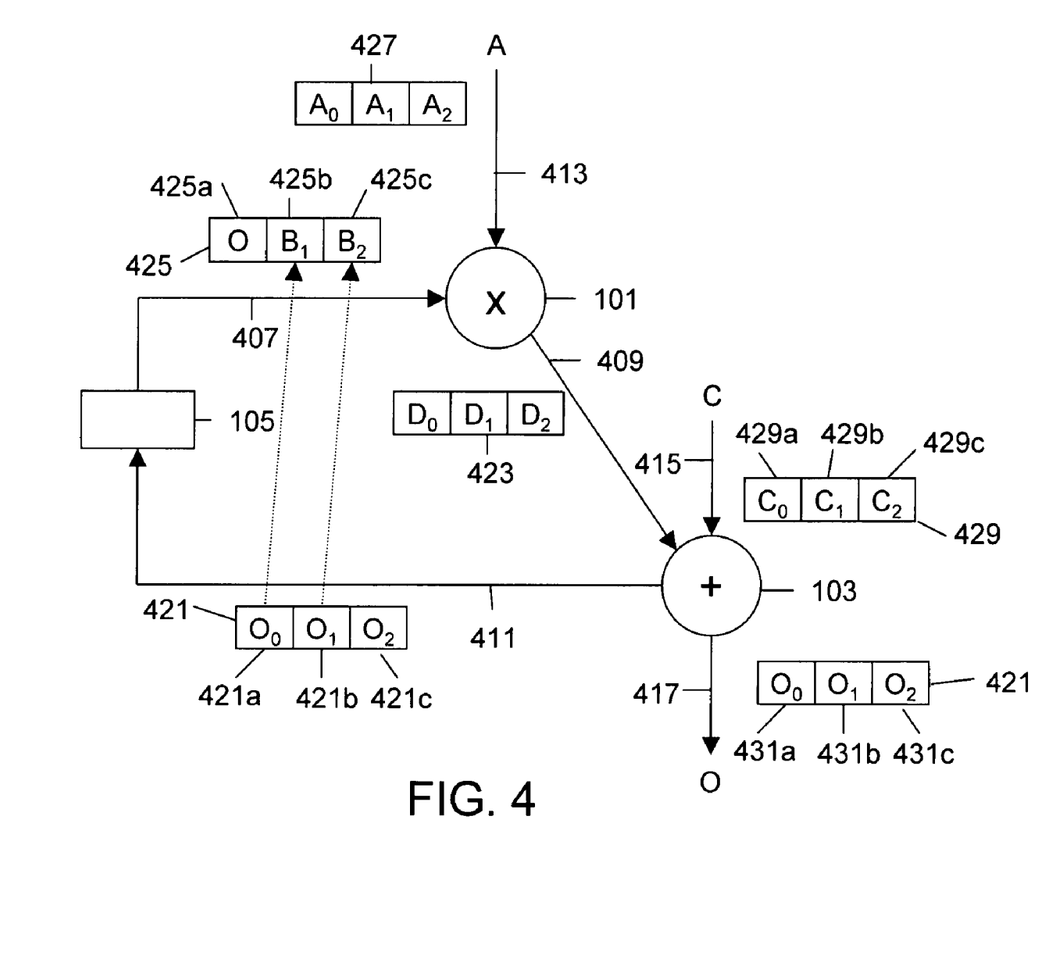
FIG. 4 illustrates a circuit diagram of the logic circuit of FIG. 1 unrolled according to the method of the present invention.

FIG. 4 illustrates a circuit diagram of the logic circuit of FIG. 1 unrolled according to the method of the present invention. The objects in FIG. 4 with which the slots are associated are edges 407, 409, 411, and 417; and nodes 413 and 415.

A plurality of slots 421 is associated with edge 411, a plurality of slots 423 is associated with edge 409, and a plurality of slots 425 is associated with edge 407. Similarly, a plurality of slots 427 is associated with node 413, a plurality of slots 429 is associated with node 415, and a plurality of slots 431 is associated with node 417.

Values of the objects at any time 't' are dependent upon the corresponding 'tick' at that time. Slots associated with each object contain information regarding 'tick' for time 't'. Based on the value of tick and the associated equations (stored in an associated database) the value of an object can be obtained.

As is evident from FIG. 3, conventional unrolling results in an increase in the memory requirements. On the other hand, by using the method of the present invention, the memory requirement is considerably reduced as shown in FIG. 4. The objects (for example, the functions such as '+') which were earlier stored twice (for the circuit represented in FIG. 1) need to be replicated and stored multiple times (six times in this case) in case of conventional unrolling. Whereas, by using the method of the present invention, the memory requirement is substantially reduced. The compression ratio obtained by using the present invention is described below.

The minimum information and memory required to represent each node in a netlist is:

Name of the node: 20 bytes
Function: 4 bytes
3-edge pointer: 12 bytes

The minimum information and memory required to represent each edge in a netlist is:

Name of edge: 20 bytes
2-node pointer: 8 bytes

In case of unrolling of a circuit by 'K' cycles, the nodes and edges are repeated 'K' times.

In accordance with the present invention, the unrolled circuit is stored in a database using a slot mechanism. Here, the inplace data for each slot is as follows:

1 slot per edge, node: 8 bytes

For a large circuit that comprises gates, where each gate has two inputs, the number of edges is approximately equal to the number of nodes. And for each cycle of unrolling, all the nodes and gates get replicated, that is, unrolling a circuit by 'K' cycles results in increasing the memory requirements by 'K' times. The compression achieved by using the method of the present invention is further illustrated with the help of the circuit represented in FIG. 1.

The circuit shown in FIG. 1 comprises six nodes and six edges. These nodes are two primary input nodes corresponding to inputs 'A' and 'C', a primary output node corresponding to output 'O', node corresponding to adder 101, node corresponding to adder 103, and node corresponding to register 105. The edges are edge 407, edge 409, edge 411, edge 413, edge 415 and edge 417.

A conventionally unrolled version of the circuit shown in FIG. 1 is shown in FIG. 3. The unrolled circuit comprises 14 nodes and 13 edges. In general, for unrolling the circuit of FIG. 1 by 'K' cycles, the total number of nodes and edges are as follows:

Nodes: 6+4(K−1); Edges: 5+4(K−1)

The data required to represent the unrolled circuit of FIG. 2 unrolled by 'K' cycles is (6+4(K−1)(36 bytes)+(5+4(K−1))(28 bytes)

There are six nodes and six edges in the circuit. As a plurality of slots is associated with each edge, the number of slots required to represent 'K' times unrolled version of the circuit according to the present invention (as shown in FIG. 4) is 6K.

The data required to represent the above circuit using the method described in the invention for K cycles is as follows:

(6)(36 bytes)+(6)(28 bytes)+6(8)(K)

The compression achieved by the present invention is as follows:

Compression ratio:

$$\frac{[(6+4(K-1))(36)+(5+4(K-1)(28))]}{[(6)(36)+(6)(28)+(6)(8)(K)]}$$

For large values of K,
Compression ratio:

$$\frac{[(4K)(36)+(4K)(28)]}{[(6)(8)(K)]}$$

≅5.3 [(5K(36 bytes)+(5)(28 bytes)]/[6(8)(K)]∼7

For very large circuits, unrolling results in the following number of nodes and edges:

Nodes: n+(n−a)(K−1);

Edges: e+(e−b)(K−1)

Where:
n is the number of nodes in the circuit that is required to be unrolled;
e is the number of edges in the circuit that is required to be unrolled;
a is the number of nodes that do not get replicated during unrolling, a is always less than n, and is dependent upon the number of memory elements included in the circuit; and
b is the number of edges that do not get replicated during unrolling, b is always less than n, and is dependent upon the number of memory elements included in the circuit.

Representation of this circuit by using the method of the present invention requires 'eK' number of slots.

Compression ratio:

$$\frac{[(n+(n-a)(K-1))(36)+(e+(e-b)(K-1))(28)]}{[(n)(36)+(e)(28)+(K)(8)(e)]}$$

For large values of K, the compression ratio is as follows:

$$\frac{[(n-a)(K)(36)+(e-b)(K)(28)]}{[(K)(8)(e)]}$$

For large circuits, implemented by using gates with two inputs, the number of edges and nodes are equal. Moreover, in such circuits, the values of constants 'a' and 'b' tend to be 0. Therefore, the compression ratio becomes:

$$\frac{[(n-a)(K)(36) + (e-b)(K)(28)]}{[(K)(8)(e)]} = \frac{[(36) + (28)]}{8} = 8$$

Thus, the method according to the present invention provides a compression ratio of 8 over the conventional unrolling of circuits.

Figure 5:
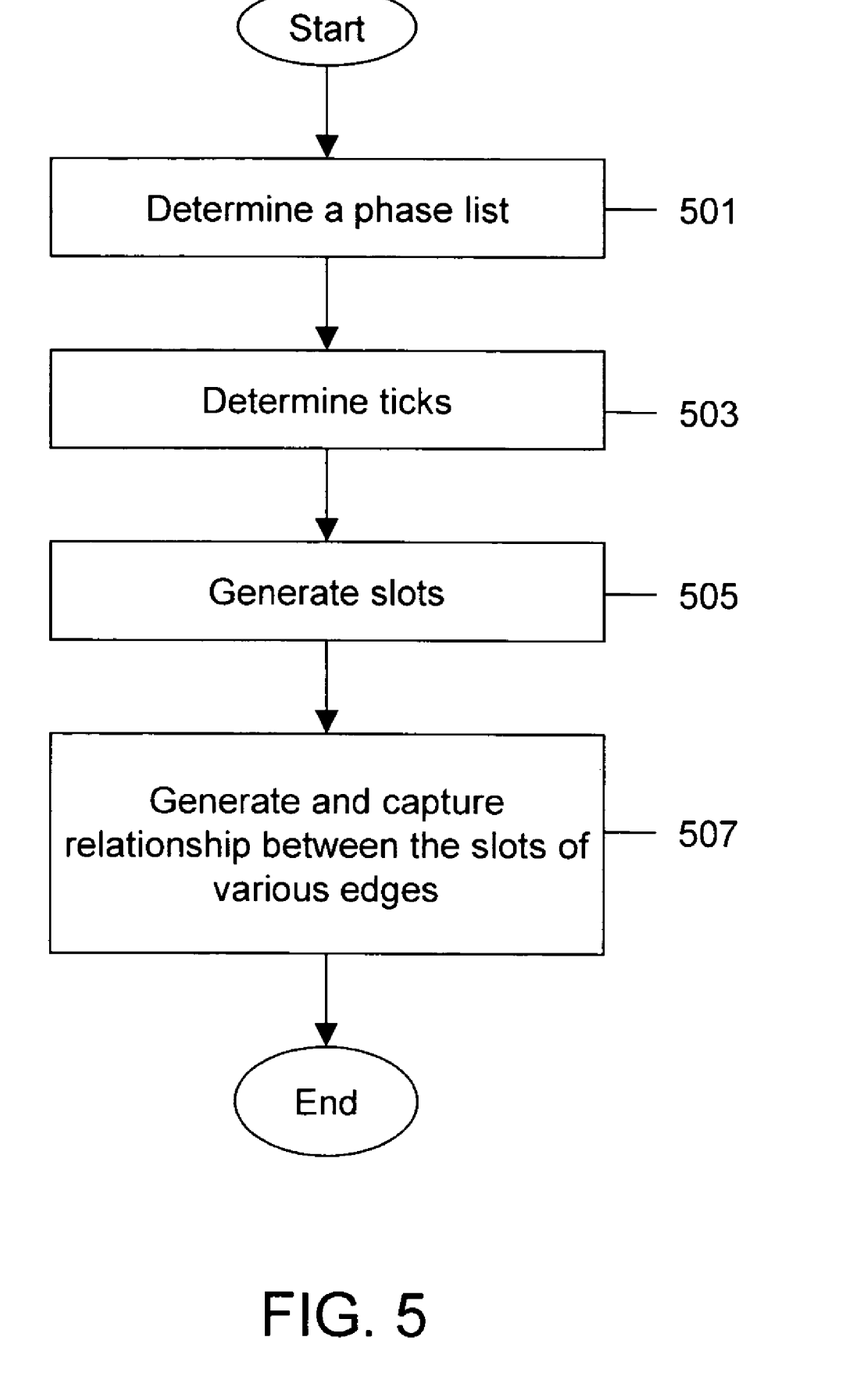
FIG. 5 represents a flowchart that shows the method for inplace symbolic simulation.

FIG. 5 is a flowchart of the method in accordance with the present invention.

At step 501, the phase-list corresponding to each edge of the circuit is determined. As described earlier, this phase-list represents all the active edges of all the clocks on which the signal value of an edge can change.

For example, the circuit illustrated in FIG. 1 is triggered by a single clock having a time-period of 100 ns, and the elements of this circuit are positive-edge triggered. In case of this circuit, the phase-list for all the edges would be the same as the circuit controlled by a single clock.

The corresponding phase-list would be:

Phase-list (E)=(0, 101, 201, 301 . . . )

At step 503, the tick values corresponding to each edge of the circuit is determined. As described earlier, tick represents the active clock triggers for an edge, and is a function of time 't' and phase-list 'E'. For the circuit illustrated in FIG. 1, the tick value for each edge would vary as follows:

Tick [t, phase-list (E)]=0 for t<100;

Tick [t, phase-list (E)]=1 for 100<t<200; and

Tick [t, phase-list (E)]=2 for 200<t<300.

As the circuit is required to be unrolled for three cycles, the tick function would be calculated for three cycles of the clock guiding the circuit.

It would be evident to a person skilled in the art that depending upon different requirements, the tick function can be calculated for different values of time 't'.

At step 505, the slots corresponding to each edge of the circuit are generated. For example, for the circuit represented in FIG. 1, slots 421, 423, 425, 427, 429, and 431 corresponding to edges 411, 409, 407, 413, 415, and 417 are generated, as represented in FIG. 4. Each slot contains the functionality of the edge at time 't'.

For the above-described circuit, the following table represents the value (functionality) of the slots 421 and 429 associated with edges 411 and 415 respectively:

TABLE 1

| Edge | Time 't' | Slot represented by | Tick | Slot function (value) |
| --- | --- | --- | --- | --- |
| 411 | 0 < t < 100 | 421a | 0 | $O_0$ |
| 411 | 100 < t < 200 | 421b | 1 | $O_1$ |
| 411 | 200 < t < 300 | 421c | 2 | $O_2$ |
| 415 | 0 < t < 100 | 429a | 0 | $C_0$ |
| 415 | 100 < t < 200 | 429b | 1 | $C_1$ |
| 415 | 200 < t < 300 | 429c | 2 | $C_2$ |

At step 507, relationships between slots of various edges are identified and captured. In this case, the relationships would be simple (direct one-to-one correspondence) as the phase-list and the tick function coincide for all the edges. For example, slot 421a, slot 421b, and slot 421c relate to slot 429a, slot 429b, and slot 429c, respectively. However, for more complex circuits, relationship between the slots could be complex. This has been later illustrated in detail with the help of Table 2.

Figure 6:
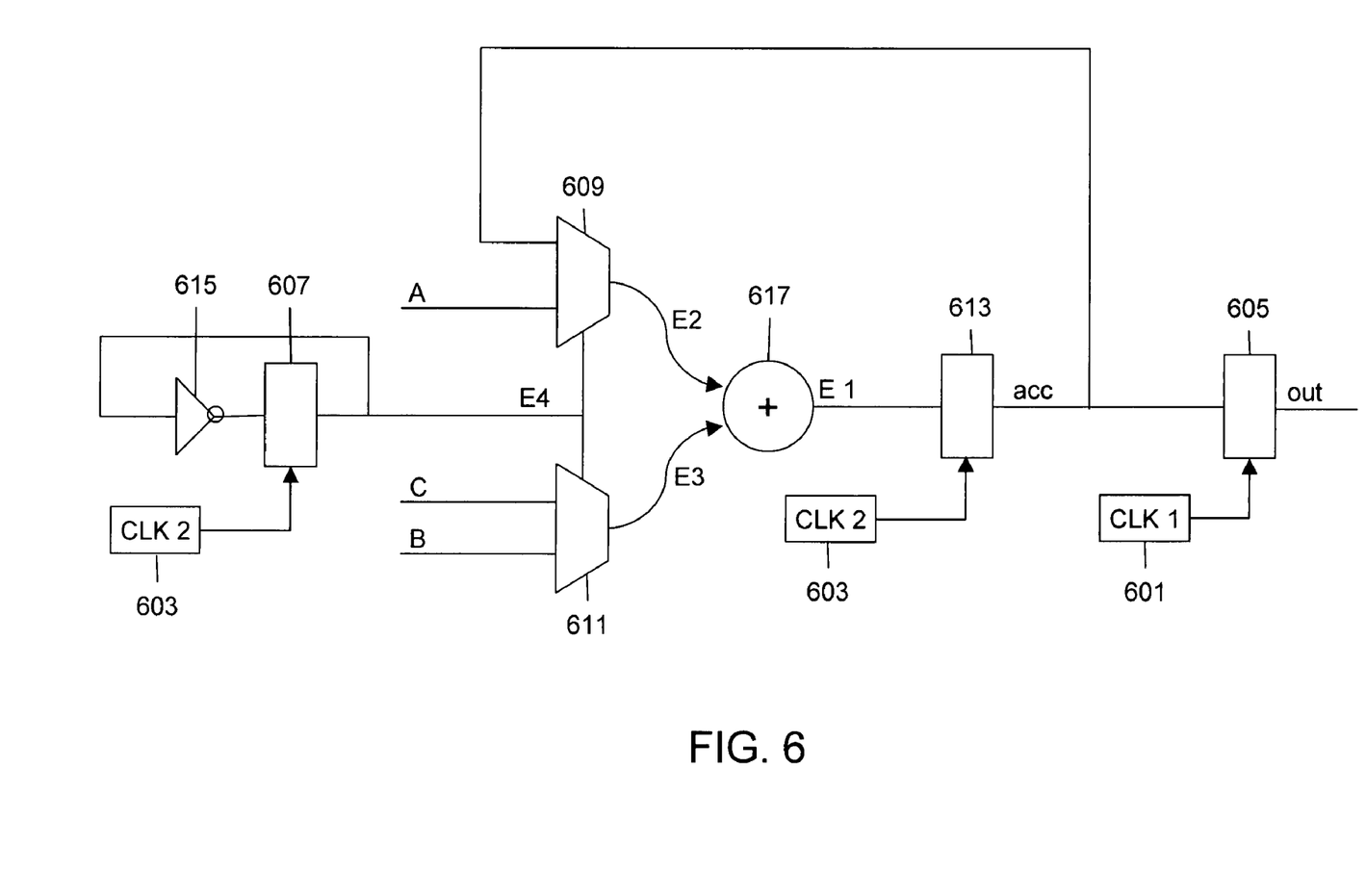
FIG. 6 illustrates another circuit diagram of a multi-clock-domain logic circuit.

The following paragraphs illustrate the use of the present invention in multi-clock domain designs. One such multi-clock domain design is shown in FIG. 6.

This circuit performs the following computation:

A+B+C

This logic circuit is controlled by two clocks, clock 601 and clock 603. Clock 601 has a time period of 100 nanoseconds (frequency $10^7$ sec$^{-1}$), and the circuit elements controlled by this clock are triggered at 10 nanoseconds from the start of each cycle. Clock 601 is also represented as CLK 1 (10, 100). Clock 603 has a time period of 50 nanoseconds (frequency $2\times10^7$ sec$^{-1}$), and the circuit elements triggered by this clock are triggered at 20 nanoseconds from the start of each cycle. Clock 601 is also represented as CLK 2 (20, 50).

Clock 601 triggers a register 605.

Clock 603 triggers a register 607, another register 613, a multiplexer 609 and another multiplexer 611. The value of registers, register 607 and register 613 are updated every cycle of clock 603. The output of register 607 is fed to multiplexer 609 and multiplexer 611 as the control signal. The output of register 607 is also fed to a NOT gate 615. NOT gate 615 inverts the signal and feeds it again to register 607. This results in inversion of values stored in register 607, every cycle.

Apart from these elements, the circuit comprises an adder 617, which performs the addition operation on the outputs of multiplexer 609 and multiplexer 611. The output of adder 617 is stored in register 613 and is provided as an input to multiplexer 609 in the next cycle.

Multiplexer 609 and multiplexer 611 are controlled by the output of register 607. When the control signal is 0, multiplexer 609 gives external input signal A as output; and when control signal is 1, multiplexer 609 gives input signal acc as output. Similarly, multiplexer 611 gives external input signal B as output when the control signal is 0, and gives external input signal C as output when control signal is 1.

Figure 7:
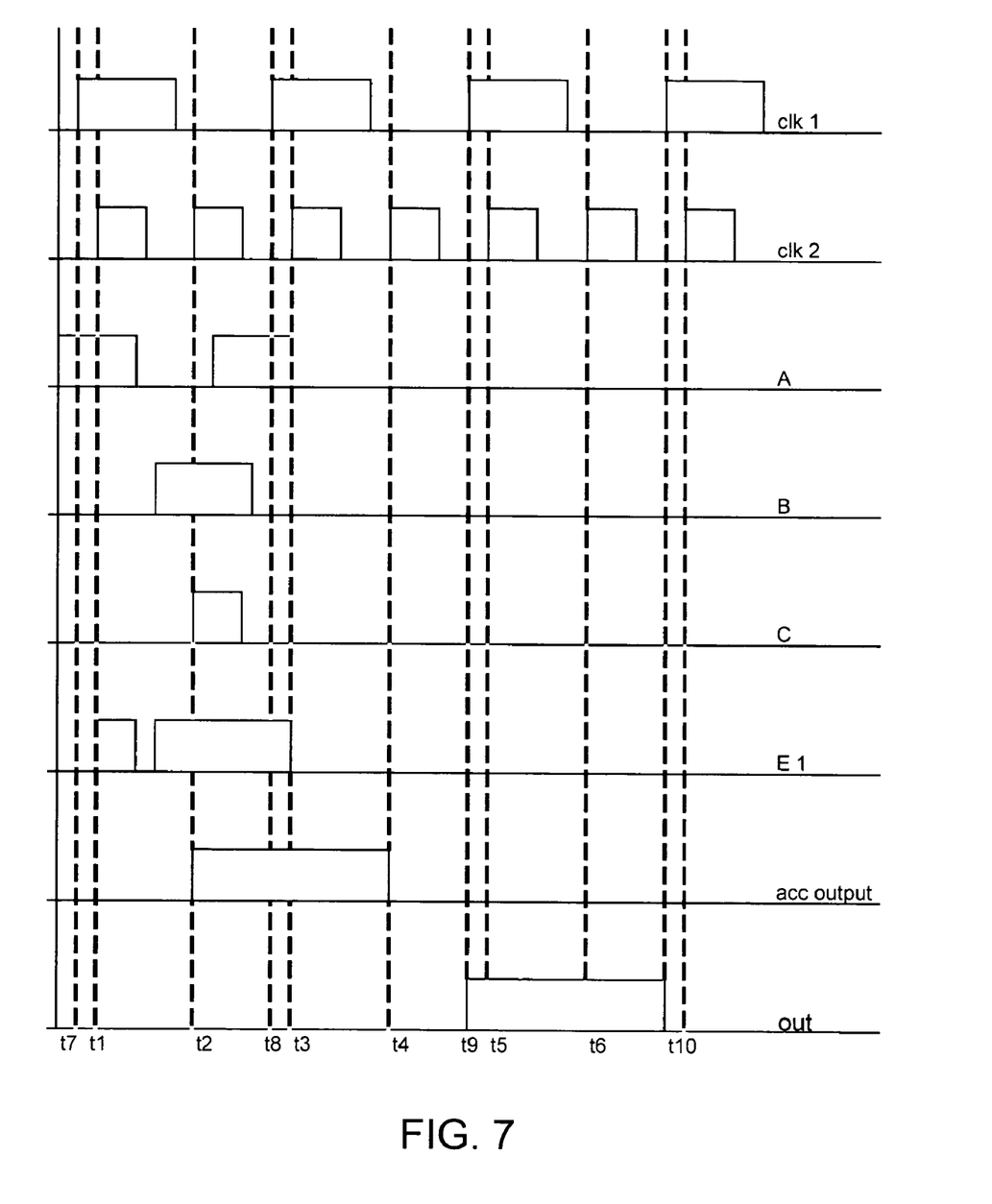
FIG. 7 illustrates a timing diagram corresponding to the circuit of FIG. 6.

The circuit implements the underlying logic in two cycles of clock 603 (i.e., one cycle of clock 601). The following is the sequence of events that is performed by the circuit. The functioning of the circuit has been further explained with the help of a timing diagram, which is illustrated by FIG. 7.

Initial values stored in all the registers are equal to zero. The following paragraphs explain the functioning of the circuit vis-à-vis the control triggers of the associated clocks.

First Trigger of Clock 603

Clock 603 triggers register 607 and the initial value stored is given as output, which is 0. The output of register 607 is fed to multiplexers 609 and 611 and also to NOT gate 615. NOT gate 615 inverts the signal and feeds it to register 607.

Output of register 607 acts as the control signal for multiplexer 609 and multiplexer 611. On receiving the control signal 0, multiplexer 609 outputs signal A and multiplexer 611 outputs signal B. These signals are fed to adder 617, which gives output 'A+B'.

The output of adder 617 is fed to register 613. The initial value stored in register 613 is 0, which is fed to multiplexer 609 as an input in the first cycle. Also, in the same cycle the stored value is updated to the output of adder 617 'A+B'.

Second Trigger of Clock 603

Clock 603 triggers register 607 and the value stored in the previous cycle is given as output, which is 1. The output of register 607 is fed to multiplexers 609 and 611 and also to NOT gate 615. NOT gate 615 inverts the signal and feeds it to register 607.

Output of register 607 acts as a control signal for multiplexer 609 and multiplexer 611. On receiving the control signal with value equal to 1, multiplexer 609 outputs signal acc, which is equal to 'A+B' and multiplexer 611 outputs signal C. These signals are fed to adder 617, which gives output 'A+B+C'.

The output of adder 617, which is 'A+B+C' is fed to register 613. The register outputs 'A+B+C' in the next cycle.

The output of register 613 is fed to register 605. Here, register 605 is driven by clock 601. Register 605 reads output of register 613 and provides it as output in the next cycle of clock 601.

The timing diagram of the circuit given in FIG. 6 is shown in FIG. 7. Initially, 0 value is stored in registers 607, 613, and 605. Therefore, on encountering the first positive edge of the corresponding clock, value 0 is provided as output of these registers. Therefore, value of signal acc and output of register 607 are 0 for time t1 to t2 and value of the signal out is 0 for time t0 to t3. In the first cycle of clock 603, signal A and signal B are the outputs of multiplexers 609 and 611, respectively. Therefore, for time t1 to t2 the output of adder 617 is 'A+B'. Neglecting the gate delays, the value stored in register 607 and register 613 is 1. For the next cycle of clock 603, i.e., for time t2 to t3, the value of the output of register 607 is 1 and the value of the output of register 613 is 1. In this cycle, the value of control signal to the multiplexers 609 and 611 is 1. Therefore, signals acc and C are fed to adder 617. The output of the adder is 'C+acc'. The value stored in register 607 is 0 and register 613 is 1.

For the next cycle of clock 603, i.e., from time t3 to t4, the output of register 607 is 0 and the output of register 613 is 1. The value of the control signal to multiplexers 609 and 611 is 0. Therefore, signals A and B are fed to adder 617. The output of adder 617 for this cycle is 'A+B'. The values stored in registers 607 and 613 are 1 and 0, respectively. In the next cycle of clock 603, i.e., from time t4 to t5, the outputs of registers 607 and 613 are 1 and 0, respectively. The value of control signal to the multiplexers is 1. Therefore, the signals fed to adder 617 are B and acc. The output of adder 617 for this cycle is 'B+acc'. The value stored in registers 607 and 613 is 0.

For the next cycle of clock 603, i.e., from time t5 to t6, the value of the outputs of registers 607 and 613 is 0.

First Trigger of Clock 601

Register 605 runs on clock 601. Initially, the value 0 is stored in the register. On encountering the positive edge of clock 601, the stored value is provided as an output. Therefore, the value of the output of register 605 is 0 for the first cycle of clock 601, i.e., from time t7 to t8. For this cycle, the value stored in register 605 is 0, which is the value of signal acc at the rising edge of clock 601, i.e., at time t7.

Second Trigger of Clock 601

For the next cycle of clock 601, i.e., from time t8 to t9, the value of the output of register 605 is 0. For this cycle, the value stored in register 605 is 1.

Third Trigger of Clock 601

For the next cycle of clock 601, i.e., from time t9 to t10, the output of register 605 is 1.

At t3 register 605 encounters a positive edge of clock 601. For this cycle of clock 601, i.e., for time t3 to t5, the output of register 605 is 0. The value stored in register 605 for this cycle is 1.

Figure 8:
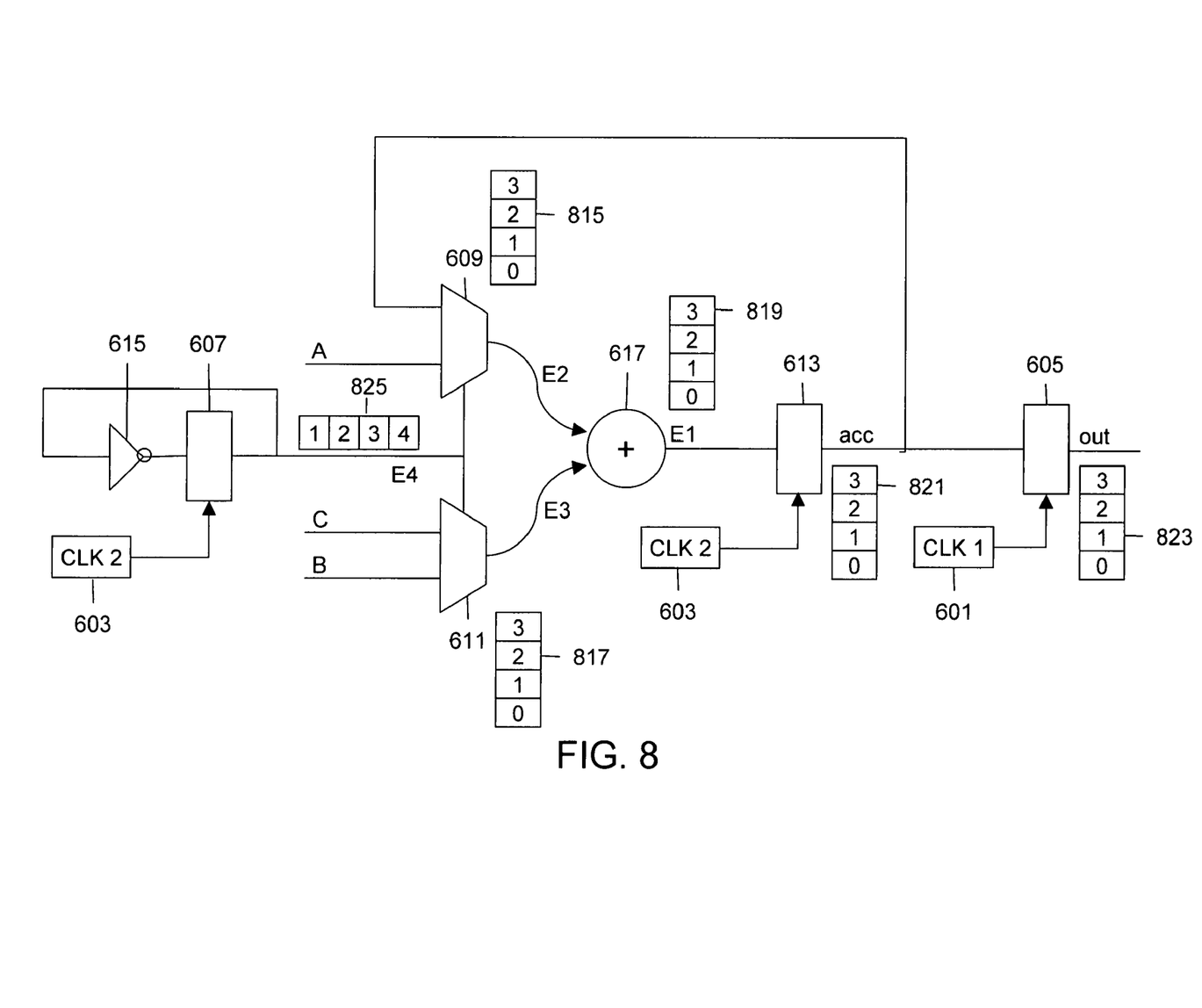
FIG. 8 illustrates the circuit diagram of a multi-clock-domain logic circuit according to an embodiment of the present invention.

FIG. 8 illustrates an inplace unrolled version of the circuit diagram of a multi-clock-domain logic circuit according to an embodiment of the present invention. In this diagram, slots are associated with objects. These slots store the value of ticks.

A plurality of slots 815 are associated with edge E2, a plurality of slots 817 are associated with edge E3, a plurality of slots 819 are associated with edge E1, a plurality of slots 821 are associated with edge acc, a plurality of slots 823 are associated with edge out, and a plurality of slots 825 are associated with edge E4.

Each of the plurality of slots 815, 817, 819, 821, 823, and 825 contain the value of tick corresponding to time 't'.

The phase-list associated with slots 815, 817, 819, 821, and 825 are dependent upon clock triggers provided by clock 603 (CLK 2 (20, 50)).

On a time scale, the phase-list would comprise the following trigger points:

t=20 ns;
t=70 ns;
t=120 ns;
t=170 ns;
t=220 ns;
t=270 ns; and so on.

The value of tick, i.e., active clock triggers for the associated slots at time t will be as follows:

t=0-20 ns, tick=0;
t=21-70 ns, tick=1;
t=71-120 ns, tick=2;
t=121-170 ns, tick=3;
t=171-220 ns, tick=4;
t=221-270 ns, tick=5;
t=271-320 ns, tick=6;
t=321-370 ns, tick=7; and so on.

There is a direct correspondence between the ticks of the edges controlled by the same triggers.

Similarly, the phase-list associated with the slot 823 is dependent upon clock triggers provided by clock 601 (CLK 1 (10, 100)).

On a time scale, the phase-list would comprise the following trigger points:

t=10 ns;
t=110 ns;
t=210 ns;
t=310 ns;
t=410 ns;
t=510 ns; and so on.

The value of tick, i.e., active clock triggers for the associated slots at time t will be as follows:

t=0-10 ns, tick=0;
t=11-110 ns, tick=1;
t=110-210 ns, tick=2;
t=211-310 ns, tick=3;
t=311-410 ns, tick=4;
t=411-510 ns, tick=5; and so on.

The output of the circuit at any time 't' is dependent upon the active clock triggers. Table 2 shows the correspondence between time and the active clock triggers (slots) of various objects.

TABLE 2

| Time | Slot 819 | Slot 825 | Slot 815 | Slot 817 | Slot 821 | Slot 823 |
|---|---|---|---|---|---|---|
| 0-10 | 0 | 0 | 0 | 0 | 0 | 0 |
| 11-20 | 0 | 0 | 0 | 0 | 0 | 1 |
| 21-70 | 1 | 1 | 1 | 1 | 1 | 1 |
| 71-110 | 2 | 2 | 2 | 2 | 2 | 1 |
| 111-120 | 2 | 2 | 2 | 2 | 2 | 2 |

TABLE 2-continued

| Time | Slot 819 | Slot 825 | Slot 815 | Slot 817 | Slot 821 | Slot 823 |
|---|---|---|---|---|---|---|
| 121-170 | 3 | 3 | 3 | 3 | 3 | 2 |
| 171-210 | 4 | 4 | 4 | 4 | 4 | 2 |
| 211-220 | 4 | 4 | 4 | 4 | 4 | 3 |
| 221-270 | 5 | 5 | 5 | 5 | 5 | 3 |
| 271-310 | 6 | 6 | 6 | 6 | 6 | 3 |
| 311-320 | 6 | 6 | 6 | 6 | 6 | 4 |
| 321-370 | 7 | 7 | 7 | 7 | 7 | 4 |

Based on the above association, the value of the edges of the circuit can be computed at any time 't'. This is illustrated with the help of the following example:

Suppose the output of the circuit is required at time=316 ns.

The output of the circuit is equal to the output of register 605. The slot associated with register 605 helps in determining the value of register 605 at any time 't'.

We know that the value of output of register 605 at time=316 ns is the value stored at register 605 in the previous clock trigger, i.e., at time=211 ns, which is equal to the output of register 613 at time=211 ns. The value output by register 613 at time=211 ns is equal to the value stored by register 613 at time=121 ns.

Similarly, a correlation between the slots associated with register 613, and the objects lying in the fan-in cone of register 613 can be established.

As discussed, the method according to the present invention unrolls a circuit inplace rather than duplicating the circuit in time. Simulation of circuit designs unrolled in time takes a large amount of time. For example, in-time unrolling repeats the circuit design several times, which, results in an increase in time required for cycle-based simulation. Inplace unrolling of circuit designs raises the abstraction level of a circuit design as compared to the in-time unrolling. This speeds up the time required for cycle-based simulation.

The system, as described in the present invention or any of its components may be embodied in the form of a processing machine. Typical examples of a processing machine include a general purpose computer, a programmed microprocessor, a micro-controller, a peripheral integrated circuit element, and other devices or arrangements of devices, which are capable of implementing the steps that constitute the method of the present invention.

The processing machine executes a set of instructions that are stored in one or more storage elements, in order to process input data. The storage elements may also hold data or other information as desired. The storage element may be in the form of a database or a physical memory element present in the processing machine.

The set of instructions may include various instructions that instruct the processing machine to perform specific tasks such as the steps that constitute the method of the present invention. The set of instructions may be in the form of a program or software. The software may be in various forms such as system software or application software. Further, the software might be in the form of a collection of separate programs, a program module with a larger program or a portion of a program module. The software might also include modular programming in the form of object-oriented programming. The processing of input data by the processing machine may be in response to user commands, or in response to results of previous processing or in response to a request made by another processing machine.

It will to evident to one skilled in the art that it is not necessary that the various processing machines and/or storage elements be physically located in the same geographical location. The processing machines and/or storage elements may be located in geographically distinct locations and connected to each other to enable communication. Various communication technologies may be used to enable communication between the processing machines and/or storage elements. Such technologies include connection of the processing machines and/or storage elements, in the form of a network.

In the system and method of the present invention, a variety of "user interfaces" may be utilized to allow a user to interface with the processing machine or machines that are used to implement the present invention. The user interface is used by the processing machine to interact with a user in order to convey or receive information. The user interface could be any hardware, software, or a combination of hardware and software used by the processing machine that allows a user to interact with the processing machine. The user interface may be in the form of a dialogue screen and may include various associated devices to enable communication between a user and a processing machine. It is contemplated that the user interface might interact with another processing machines rather than a human user. Further, it is also contemplated that the user interface may interact partially with other processing machines while interacting partially with the human user also.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

What is claimed is:

1. A method for inplace symbolic simulation of a multi-clock-domain design circuit over multiple cycles, the design comprising a plurality of clocks, the method comprising the steps of:
   a. determining a phase-list for each edge, the phase-list for an edge representing all the phases on which the signal value of the edge can change;
   b. determining a plurality of ticks associated with each edge of the circuit, the ticks associated with an edge representing all the active clock triggers associated with that edge for the multiple cycles of the clocks over which the circuit is being simulated;
   c. generating a plurality of slots associated with each edge, all slots associated with an edge representing the value of the edge for different tick values;
   d. generating a relationship between slots of the multiple edges; and
   e. outputting the simulated circuit to a database, the simulated circuit being represented by the relationship generated between the slots of the multiple edges.

2. The method according to claim 1, wherein the multi-clock-domain design circuit comprises Boolean logic elements and memory elements.

3. The method according to claim 1, wherein the multi-clock-domain design circuit comprises multiplexers and memory elements.

4. The method according to claim 1, wherein the multi-clock-domain design circuit comprises Arithmetic elements and memory elements.

5. The method according to claim 1, wherein the multi-clock-domain design circuit comprises synchronous clocks.

6. The method according to claim 1, wherein the multi-clock-domain design circuit comprises asynchronous clocks.

7. The method according to claim 1, wherein the step of determining a phase-list comprises determining the phases of the primary input node as provided by a user if the edge is driven by a primary input.

8. The method according to claim 1, wherein the step of determining a phase-list comprises merging of all the phase-lists of the input edges of the combination gate if the edge if driven by a combination gate.

9. The method according to claim 1, wherein the step of determining a phase-list comprises determining the phase-list of the clock-signal coming into the sequential element if the edge is driven by a sequential element.

10. The method according to claim 1, wherein the step of generating a plurality of slots comprises determining the value of the edge for different tick values using the fan-in cone associated with the edge.

11. The method according to claim 1, wherein the step of generating a relationship between slots of multiple edges is based on time and active clock triggers.

12. A method for inplace symbolic simulation of a circuit, the circuit comprising a clock, the simulation being carried over multiple cycles of the clock, the method comprising the steps of:
   a. determining a phase-list for each edge, the phase-list for an edge representing all the phases on which the signal value of the edge can change;
   b. determining a plurality of ticks associated with each edge of the circuit, the ticks associated with an edge representing all the active clock triggers associated with that edge for the multiple cycles of the clock over which the circuit is being simulated;
   c. an edge representing the value of the edge for different tick values;
   d. generating a relationship between slots of the multiple edges; and
   e. outputting the simulated circuit to a database, the simulated circuit being represented by the relationship generated between the slots of the multiple edges.

13. The method according to claim 12, wherein the circuit comprises Boolean logic elements and memory elements.

14. The method according to claim 12, wherein the circuit comprises multiplexers and memory elements.

15. The method according to claim 12, wherein the circuit comprises Arithmetic elements and memory elements.

16. The method according to claim 12, wherein the step of determining a phase-list comprises determining the phases of the primary input node as provided by user if the edge is driven by a primary input.

17. The method according to claim 12, wherein the step of determining a phase-list comprises merging of all the phase-lists of the input edges of the combination gate if the edge if driven by a combination gate.

18. The method according to claim 12, wherein the step of determining a phase-list comprises determining the phase-list of the clock-signal coming into the sequential element if the edge is driven by a sequential element.

19. The method according to claim 12, wherein the step of generating a plurality of slots comprises determining the value of the edge for different tick values using the fan-in cone associated with the edge.

20. The method according to claim 12, wherein the step of generating a relationship between slots of multiple edges is based on time and active clock triggers.

21. A system for inplace symbolic simulation of a multi-clock-domain design circuit over multiple cycles, the design comprising a plurality of clocks, the system comprising:
   a. means for determining a phase-list for each edge, the phase-list for an edge representing all the phases on which the signal value of the edge can change;
   b. means for determining a plurality of ticks associated with each edge of the circuit, the ticks associated with an edge representing all the active clock triggers associated with that edge for the multiple cycles of the clocks over which the circuit is being simulated;
   c. means for generating a plurality of slots associated with each edge, all slots associated with an edge representing the value of the edge for different tick values; and
   d. means for generating a relationship between slots of the multiple edges.

22. A system for inplace symbolic simulation of a circuit, the circuit comprising a clock, the simulation being carried over multiple cycles of the clock, the system comprising:
   a. means for determining a phase-list for each edge, the phase-list for an edge representing all the phases on which the signal value of the edge can change;
   b. means for determining a plurality of ticks associated with each edge of the circuit, the ticks associated with an edge representing all the active clock triggers associated with that edge for the multiple cycles of the clock over which the circuit is being simulated;
   c. means for generating a plurality of slots associated with each edge, all slots associated with an edge representing the value of the edge for different tick values; and
   d. means for generating a relationship between slots of the multiple edges.

23. A computer program product for use with a computer, the computer program product comprising a computer usable medium having a computer readable program code embodied therein for inplace symbolic simulation of a multi-clock-domain design circuit over multiple cycles, the design comprising a plurality of clocks, the computer program code performing the steps of:
   a. determining a phase-list for each edge, the phase-list for an edge representing all the phases on which the signal value of the edge can change;
   b. determining a plurality of ticks associated with each edge of the circuit, the ticks associated with an edge representing all the active clock triggers associated with that edge for the multiple cycles of the clocks over which the circuit is being simulated;
   c. an edge representing the value of the edge for different tick values;
   d. generating a relationship between slots of the multiple edges; and
   e. outputting the simulated circuit to a database, the simulated circuit being represented by the relationship generated between the slots of the multiple edges.

24. A computer program product for use with a computer, the computer program product comprising a computer usable medium having a computer readable program code embodied therein for inplace symbolic simulation of a circuit, the circuit comprising a clock, the simulation being carried over multiple cycles of the clock, the computer program code performing the steps of:
   a. determining a phase-list for each edge, the phase-list for an edge representing all the phases on which the signal value of the edge can change;
   b. determining a plurality of ticks associated with each edge of the circuit, the ticks associated with an edge representing all the active clock triggers associated with that edge for the multiple cycles of the clocks over which the circuit is being simulated;

c. an edge representing the value of the edge for different tick values;

d. generating a relationship between slots of the multiple edges; and e. outputting the simulated circuit to a database, the simulated circuit being represented by the relationship generated between the slots of the multiple edges.

\* \* \* \* \*